(12) United States Patent
Ju (10) Patent No.: US 10,199,748 B2
(45) Date of Patent: Feb. 5, 2019

(54) ELECTRICAL CONNECTOR AND TERMINAL THEREOF

(71) Applicant: LOTES CO., LTD, Keelung (TW)

(72) Inventor: Ted Ju, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/868,177

(22) Filed: Jan. 11, 2018

(65) Prior Publication Data

US 2018/0309211 A1    Oct. 25, 2018

(30) Foreign Application Priority Data

Apr. 24, 2017 (CN) .......................... 2017 1 0270519

(51) Int. Cl.
| H01R 12/00 | (2006.01) |
| H01R 4/02 | (2006.01) |
| H01R 12/70 | (2011.01) |
| H01R 13/22 | (2006.01) |
| H01R 13/40 | (2006.01) |
| H01R 12/57 | (2011.01) |
| H05K 7/10 | (2006.01) |
| H01R 13/11 | (2006.01) |

(52) U.S. Cl.
CPC ............. *H01R 4/027* (2013.01); *H01R 12/57* (2013.01); *H01R 12/7076* (2013.01); *H01R 13/22* (2013.01); *H01R 13/40* (2013.01); *H05K 7/10* (2013.01); *H01R 13/111* (2013.01)

(58) Field of Classification Search
CPC ...... H01R 13/22; H01R 13/40; H01R 13/111; H01R 12/7076; H01R 4/027

USPC .................................................... 439/83, 68
See application file for complete search history.

(56) References Cited

U.S. PATENT DOCUMENTS 5,984,694 A * 11/1999 Sinclair .................. H01R 13/04
439/70
6,019,611 A * 2/2000 McHugh ............ H01R 13/2435
439/515

(Continued)

FOREIGN PATENT DOCUMENTS

| CN | 201436723 U | 4/2010 |
| CN | 203056199 U | 7/2013 |
| TW | 651726 U | 9/2003 |

*Primary Examiner* — Abdullah A Riyami
*Assistant Examiner* — Vladimir Imas
(74) *Attorney, Agent, or Firm* — Tim Tingkang Xia, Esq.; Locke Lord LLP (57) ABSTRACT

An electrical connector, used for electrically connecting a chip module to a circuit board, comprising: an insulating body, provided with a plurality of accommodating openings; and a plurality of terminals, correspondingly accommodated in the accommodating openings respectively, wherein each terminal has a connection portion, two sides of the connection portion bend and extend to form a first clamping arm and a second clamping arm, respectively, the first clamping arm and the second clamping arm together clamp a solder material, the first clamping arm has a first upper edge and a first lower edge arranged opposite to each other, and the length of the first upper edge is not equal to the length of the first lower edge. Under conditions of not increasing the length of a metal billet, the length of the first upper edge is increased, and the length of the first lower edge is decreased.

20 Claims, 10 Drawing Sheets

(56) References Cited

U.S. PATENT DOCUMENTS

| | | | | |
|---|---|---|---|---|
| 6,179,624 B1* | 1/2001 | McHugh | .............. | H05K 7/1069 |
| | | | | 439/66 |
| 6,488,523 B1 | 12/2002 | Lai | | |
| 6,501,665 B1* | 12/2002 | Ted | ............... | H05K 3/3426 |
| | | | | 174/257 |
| 6,533,590 B1* | 3/2003 | Lee | ............... | H01R 4/027 |
| | | | | 439/83 |
| 6,731,516 B1* | 5/2004 | Ma | ............... | H01R 12/57 |
| | | | | 361/785 |
| 7,052,289 B1* | 5/2006 | Hao | ............... | H01R 12/57 |
| | | | | 439/83 |
| 7,682,165 B2* | 3/2010 | Liao | ............... | H05K 3/3426 |
| | | | | 439/342 |
| 7,771,209 B2* | 8/2010 | Chang | ............... | H01R 13/2407 |
| | | | | 439/66 |
| 8,052,436 B1* | 11/2011 | Ju | ............... | H01R 12/57 |
| | | | | 439/342 |
| 8,441,275 B1* | 5/2013 | Alladio | ............... | G01R 1/0466 |
| | | | | 324/756.01 |
| 8,708,716 B1* | 4/2014 | Ho | ............... | H01R 12/714 |
| | | | | 439/83 |
| 9,130,321 B2* | 9/2015 | Chang | ............... | H01R 12/716 |
| 9,172,160 B2* | 10/2015 | Heppner | ............ | H01R 12/7076 |
| 9,806,444 B1* | 10/2017 | Ju | ............... | H01R 12/585 |
| 9,917,386 B1* | 3/2018 | Ju | ............... | H01R 12/52 |
| 9,954,312 B1* | 4/2018 | Ju | ............... | H01R 12/707 |
| 2007/0249240 A1* | 10/2007 | Chiang | ............... | H05K 3/3426 |
| | | | | 439/850 |

\* cited by examiner

ELECTRICAL CONNECTOR AND TERMINAL THEREOF

CROSS-REFERENCE TO RELATED APPLICATIONS

This non-provisional application claims priority to and the benefit of, pursuant to 35 U.S.C. § 119(a), Patent Application Serial No. 201710270519.5 filed in P.R. China on Apr. 24, 2017, the entire content of which is hereby incorporated by reference.

FIELD OF THE INVENTION

The present invention relates to an electrical connector and a terminal thereof, and more particularly to an electrical connector and a terminal thereof which stably clamp a solder material.

BACKGROUND OF THE INVENTION

Figure 8:
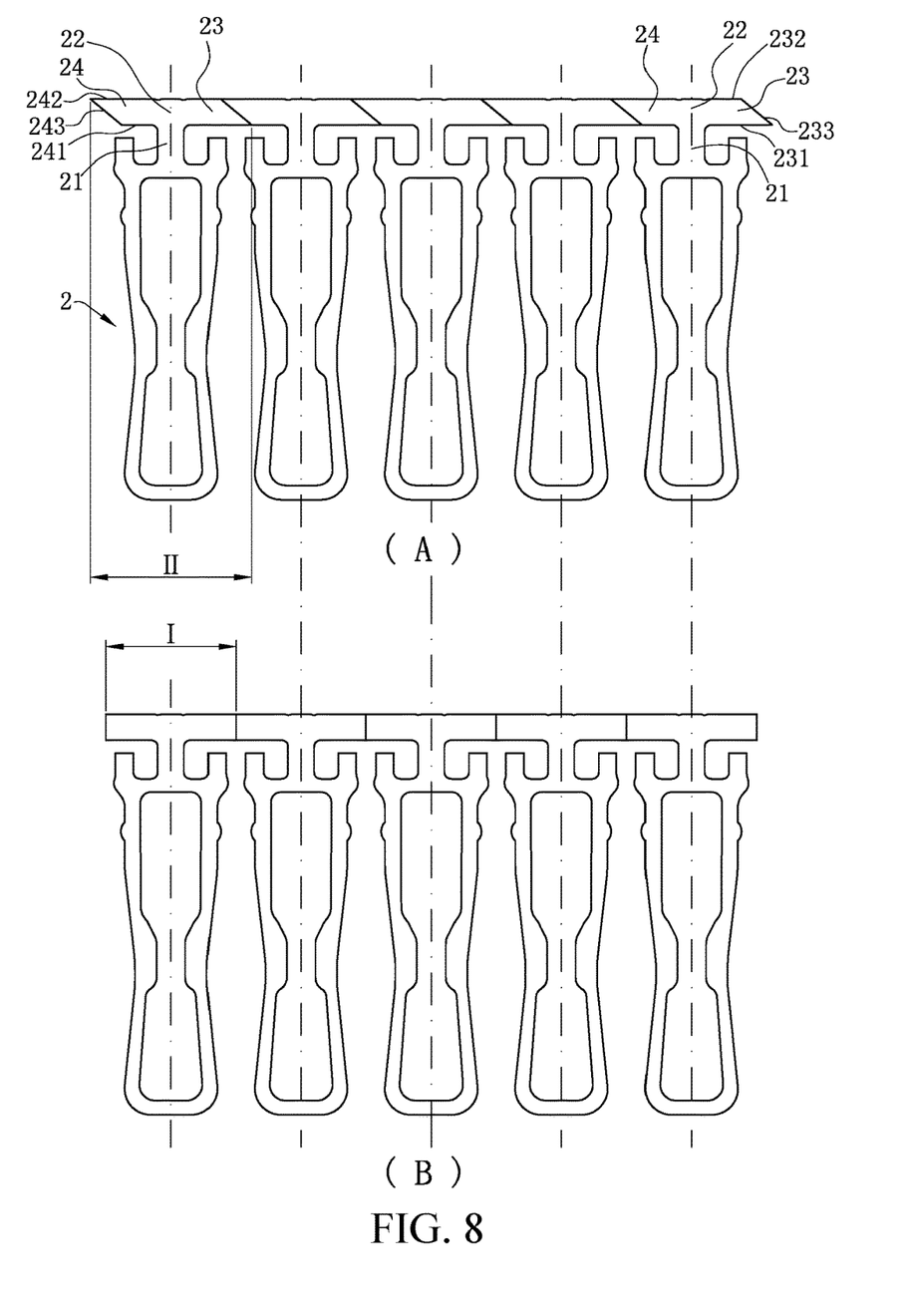
FIG. 8 is a comparison diagram between an expanded view (A) of a terminal according to the first embodiment of the present invention and an expanded view (B) of a known terminal.

At the present, an electrical connector which is commonly used in the industry for connecting a chip module with a circuit board includes an insulating body, a plurality of conductive terminals and a plurality of tin balls. The insulating body is provided with a plurality of accommodating openings, corresponding to the conductive terminals and the tin balls. Each conductive terminal has a base fixed in an accommodating opening, a connection portion formed by extending downward from the base, and a soldering portion, wherein the soldering portion includes two clamping portions, which are formed by bending and extending from the connection portion towards two sides, respectively. The two clamping portions get close to each other, and the length of the upper fringe of each clamping portion is equal to that of the lower fringe of each clamping portion, and each tin ball is correspondingly clamped between the two clamping portions. However, as shown in FIG. 8(B), the length of each clamping portion is I. In order to save metal billet and reduce the production cost of the connector, the same metal billet is needed to be cut to form a plurality of clamping portions. And under a condition of not increasing a distance between terminals, the length I of each clamping portion is limited, thereby resulting in insufficient clamping force of the clamping portions against the tin ball. This insufficient force easily causes separation of the tin ball from the terminal, poor soldering between the terminal and the circuit board, and reduction of the product qualification ratio of the electrical connector.

Therefore, a heretofore unaddressed need exists in the art to address the aforementioned deficiencies and inadequacies.

SUMMARY OF THE INVENTION

Aiming at the problems confronting the background art, the objective of the creation of the present invention is to provide a novel electrical connector in order to increases the clamping force of a terminal against a tin ball, so as to guarantee the soldering quality between the terminal and a circuit board.

In order to achieve the above-mentioned objective, the present invention adopts the following technical means:

One aspect of the present invention provides an electrical connector, used for electrically connecting a chip module to a circuit board, comprising: an insulating body, provided with a plurality of accommodating openings; and a plurality of terminals, correspondingly accommodated in the accommodating openings respectively, wherein each terminal has a connection portion, two sides of the connection portion bend and extend to form a first clamping arm and a second clamping arm, respectively, the first clamping arm and the second clamping arm together clamp a solder material, the first clamping arm has a first upper edge and a first lower edge arranged opposite to each other, and the length of the first upper edge is not equal to the length of the first lower edge.

In certain embodiments, the first clamping arm and the second clamping arm are symmetrically arranged about the center of the connection portion.

In certain embodiments, the solder material is a tin ball, and the first clamping arm and the second clamping arm cross the central surface of the solder material in a vertical direction.

In certain embodiments, the first upper edge crosses the central surface of the solder material in the vertical direction, and the first lower edge does not pass over the central surface of the solder material in the vertical direction.

In certain embodiments, the first upper edge is formed by bending and extending from one side of the connection portion towards a direction away from the connection portion first and then reversely bending and extending, and the first lower edge is formed by bending and extending from one side of the connection portion towards a direction away from the connection portion.

In certain embodiments, the second clamping arm has a second upper edge and a second lower edge arranged opposite to each other, the first upper edge is located above the central surface of the solder material in a horizontal direction, and the second lower edge is located below the central surface of the solder material in the horizontal direction.

In certain embodiments, the first clamping arm has a first slope connecting the first upper edge with the first lower edge, and the first slope inclines downward.

In certain embodiments, the first clamping arm has a first step connecting the first upper edge with the first lower edge.

In certain embodiments, the fringe of the first lower edge inclines towards a direction getting close to the solder material, to form a guide surface.

In certain embodiments, the first upper edge is accommodated in the accommodating opening, and the first lower edge is located outside the accommodating opening.

In certain embodiments, the terminal has a base, the base extends downward to form the connection portion, the base extends upward and then horizontally bends and extends to form two elastic arms arranged opposite to each other, and the two elastic arms clamp pins of the chip module.

In certain embodiments, a plurality of the terminals are fixed on the insulating body in a multi-row manner, the second clamping arm has a second upper edge and a second lower edge arranged opposite to each other, and the sum of the length of the first lower edge, the length of the second lower edge and the length of the lower fringe of the connection portion is greater than a distance between two adjacent terminals.

In another aspect, the present invention provides a terminal, comprising: a base; a contact portion, formed by extending upward from the base; a connection portion, formed by extending downward from the base; a first clamping arm, formed by bending from one side of the connection portion, wherein the first clamping arm has a first upper edge and a first lower edge arranged opposite to each other, and the first upper edge is closer to the contact portion than the first lower edge; a second clamping arm, formed by bending from the other side of the connection portion, wherein the second clamping arm has a second upper edge and a second lower edge arranged opposite to each other, the second upper edge is closer to the contact portion than the second lower edge, and the length of the first upper edge is not equal to the length of the second upper edge.

In certain embodiments, the first clamping arm and the second clamping arm are symmetrically arranged about the center of the connection portion.

In certain embodiments, the first upper edge is formed by bending and extending from one side of the connection portion towards a direction away from the connection portion first and then reversely bending and extending, and the first lower edge is formed by bending and extending from one side of the connection portion towards a direction away from the connection portion.

In certain embodiments, the first clamping arm has a first slope connecting the first upper edge with the first lower edge, and the first slope inclines downward.

In certain embodiments, the first clamping arm has a first step for connecting the first upper edge with the second upper edge.

In certain embodiments, the fringes of the first lower edge and the second lower edge incline towards a direction getting close to the connection portion, to form a guide surface.

In certain embodiments, the connection portion is flat-plate-shaped, and the first clamping arm and the second clamping arm are arc-shaped.

In certain embodiments, the contact portion is two elastic arms arranged opposite to each other, wherein the base extends upward and then horizontally bends and extends to form the two elastic arms arranged opposite to each other.

Compared with the related art, certain embodiments of the invention have the following beneficial advantages:

The length of the first upper edge is not equal to the length of the first lower edge; if the length of the first upper edge is greater than the length of the first lower edge, under conditions of not increasing the length of a metal billet and not changing the distance between the terminals, the length of the first upper edge is increased, and the length of the first lower edge is decreased. In other words, the length of the whole first clamping arm is increased, thereby increasing the clamping force of the first clamping arm and the second clamping arm against the tin ball, avoiding poor soldering between the terminal and the circuit board, and improving the production qualification rate of the electrical connector.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-10. In accordance with the purposes of this invention, as embodied and broadly described herein, this invention, in one aspect, relates to an electrical connector.

Figure 2:
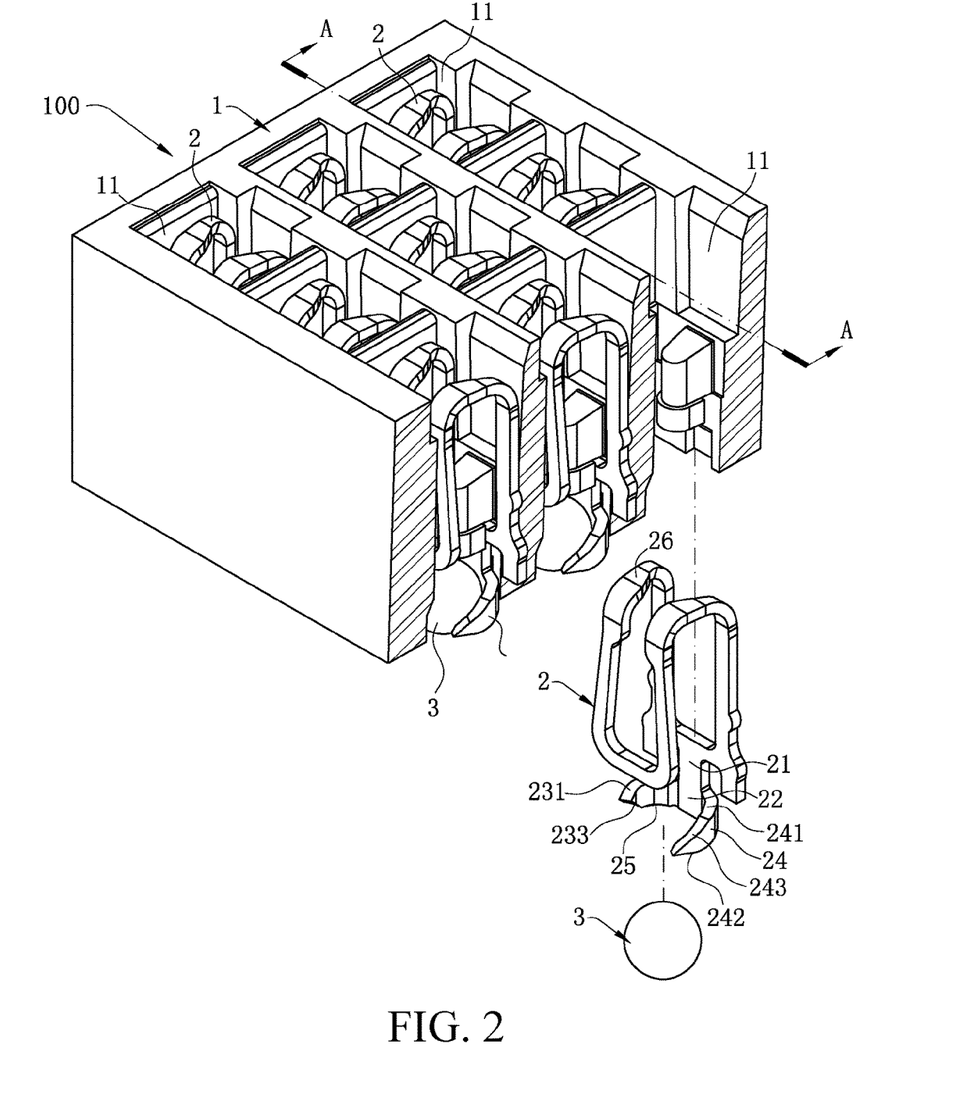
FIG. 2 is a local three-dimensional exploded view of an electrical connector according to a first embodiment of the present invention.
Figure 6:
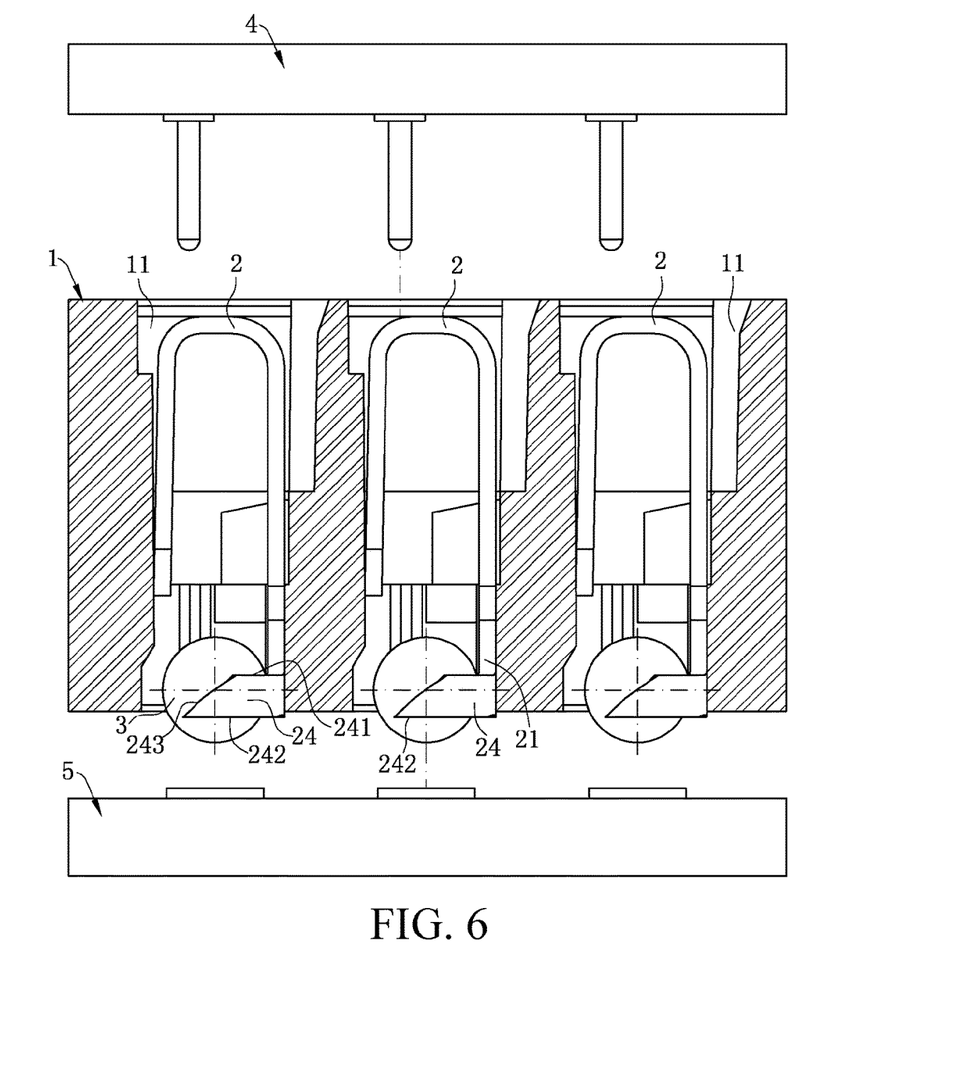
FIG. 6 is a right side view of the electrical connector, before being assembled with a chip module and a circuit board, according to the first embodiment of the present invention.
Figure 7:
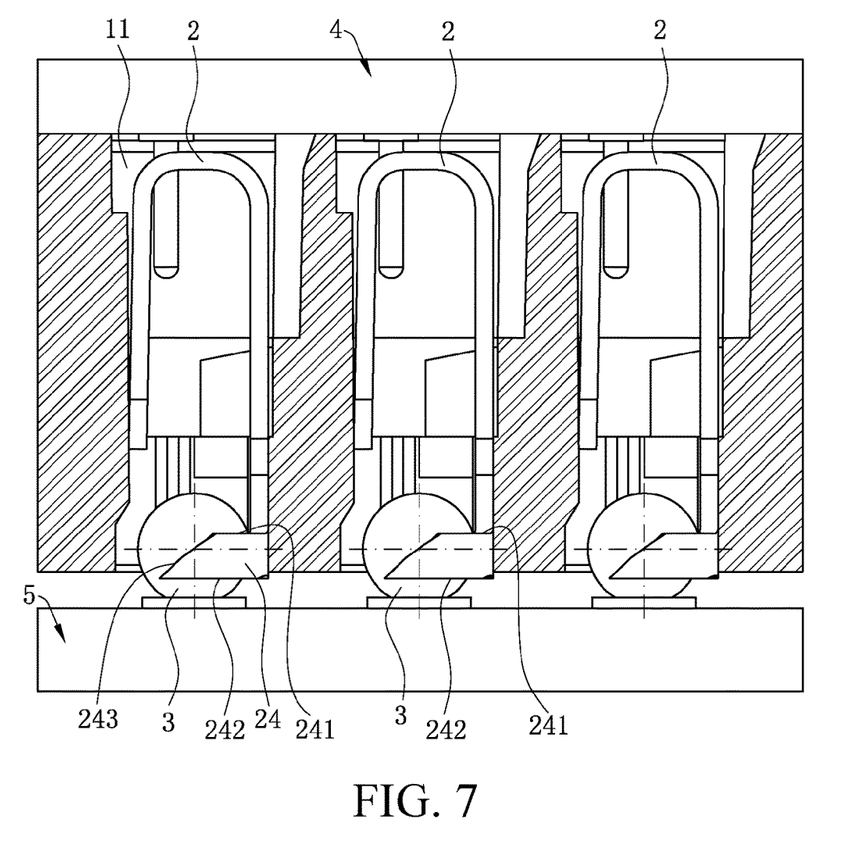
FIG. 7 is a right side view of the electrical connector, after being assembled with a chip module and a circuit board, according to the first embodiment of the present invention.

A first embodiment of an electrical connector 100 of the present invention is shown in FIG. 2, FIG. 6 and FIG. 7. The electrical connector 100 of the present invention is a PGA packaging array electrical connector 100, used for electrically connecting a chip module 4 with a circuit board 5. The electrical connector 100 includes an insulating body 1, which is provided with a plurality of accommodating openings 11; and a plurality of terminals 2, correspondingly inserted into the accommodating openings 11 from above to below, respectively, wherein each terminal 2 is soldered to the circuit board 5 via a solder material 3. In the present embodiment, the solder material 3 is a tin ball. While in other embodiments, as long as the solder material 3 enables the terminal 2 to be soldered to the circuit board 5, the solder material 3 can be made of any material or be of any shape without limitation.

Figure 3:
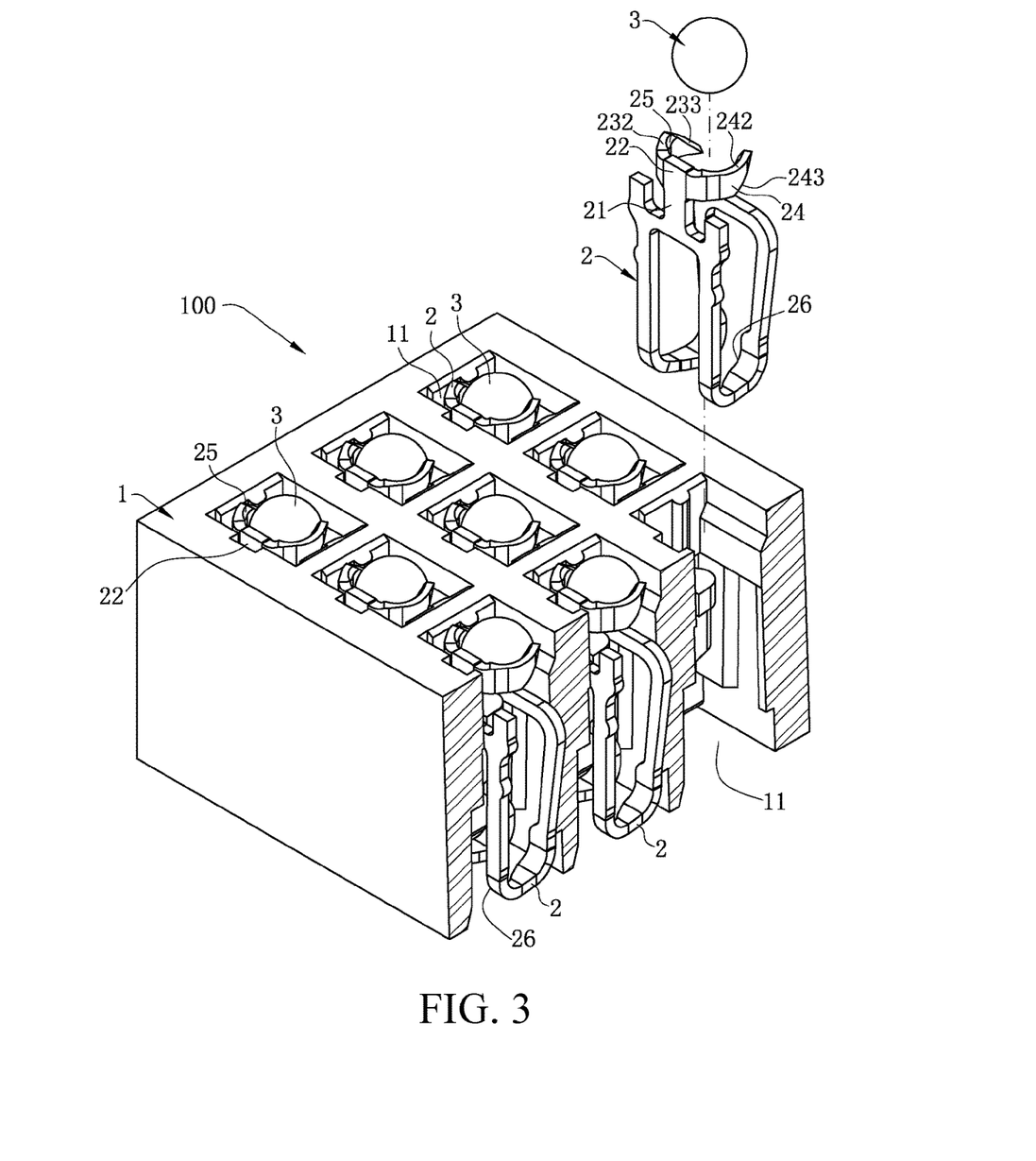
FIG. 3 is a local partial three-dimensional exploded view of the electrical connector according the first embodiment of the present invention, viewed from another viewing angle.
Figure 4:
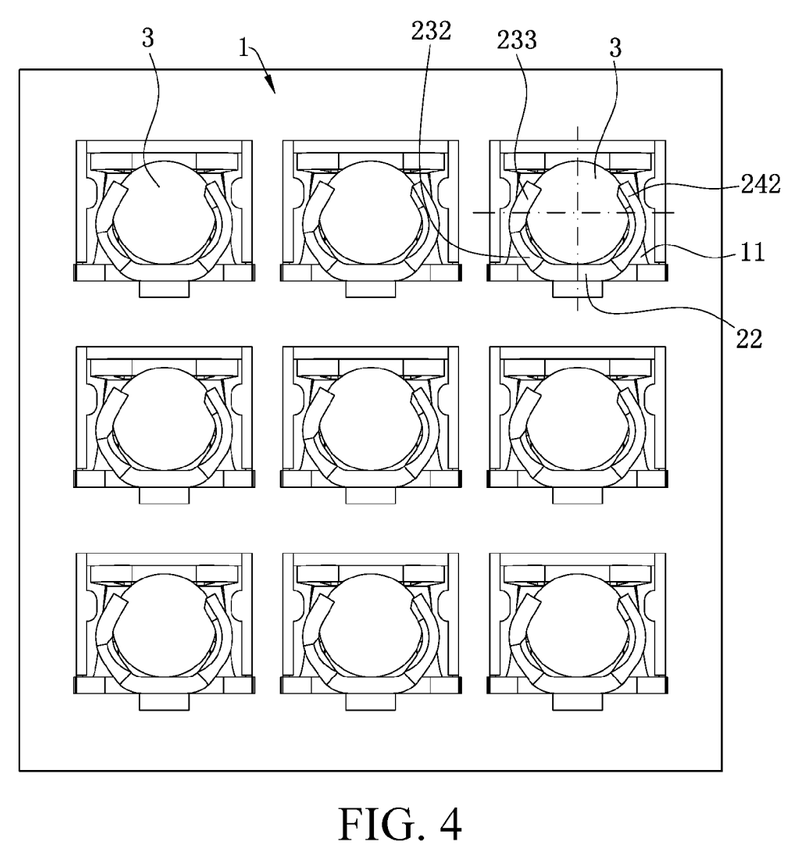
FIG. 4 is a local bottom view of the electrical connector according to the first embodiment of the present invention.

As shown in FIG. 3 and FIG. 4, a plurality of the accommodating openings 11 are formed by running through the insulating body 1, and are arranged in a multi-row manner, and the number of accommodating openings 11 in each row is equal. Each terminal 2 is correspondingly accommodated in one accommodating opening 11, therefore, a plurality of the terminals 2 are also arranged in the multi-row manner.

Figure 5:
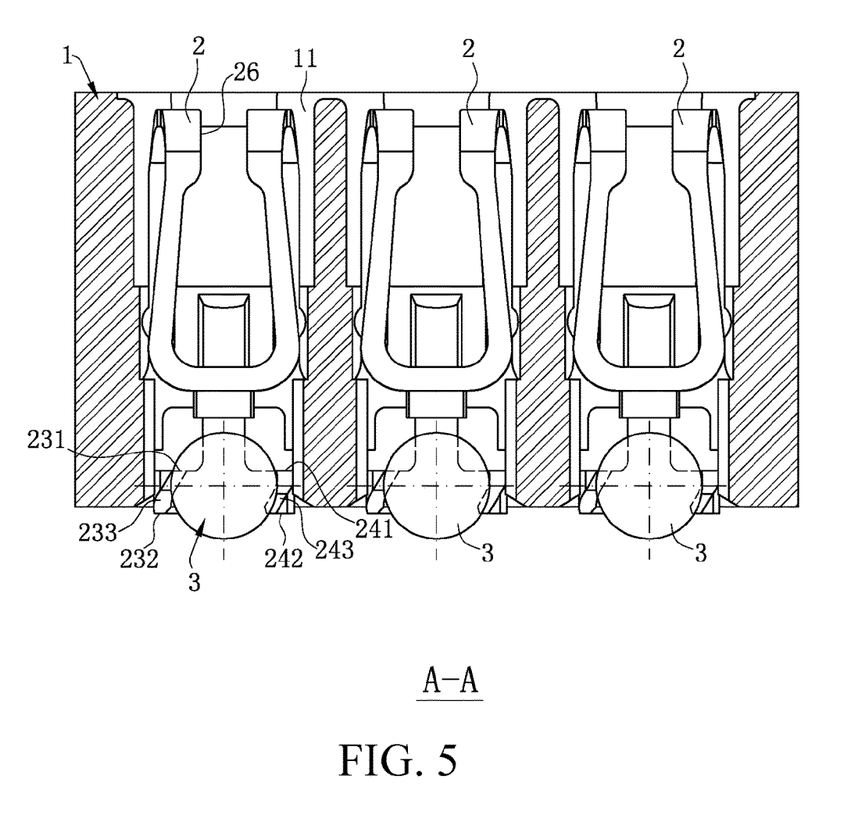
FIG. 5 is a sectional view of the electrical connector according to the first embodiment of the present invention along an A-A direction.

As shown in FIG. 3, FIG. 5 and FIG. 7, each terminal 2 has a flat-plate-shaped base 21, and a contact portion 26 is formed by extending upward from the base 21, and abuts the chip module 4. In the present embodiment, the contact portion 26 is two elastic arms arranged opposite to each other, wherein the base extends upward and then horizontally bends and extends to form the two elastic arms arranged opposite to each other. The two elastic arms clamp pins of the chip module 4, to make the terminal 2 in conductive connection with the chip module 4. The base 21 extends downward to form a connection portion 22, and the connection portion 22 is also flat-plate-shaped and has a width equal to that of the base 21. One side of the connection portion 22 bends to form a first clamping arm 23, and the other side of the connection portion 22 bends to form a second clamping arm 24. The first clamping arm 23 and the second clamping arm 24 together clamp the solder material 3, and the solder material 3 is soldered to the circuit board 5, to make the terminal 2 in conductive connection with the circuit board 5. Further, the first clamping arm 23 and the second clamping arm 24 are arc-shaped, so that the first clamping arm 23 and the second clamping arm 24 have a larger contact area with the solder material 3.

Figure 1:
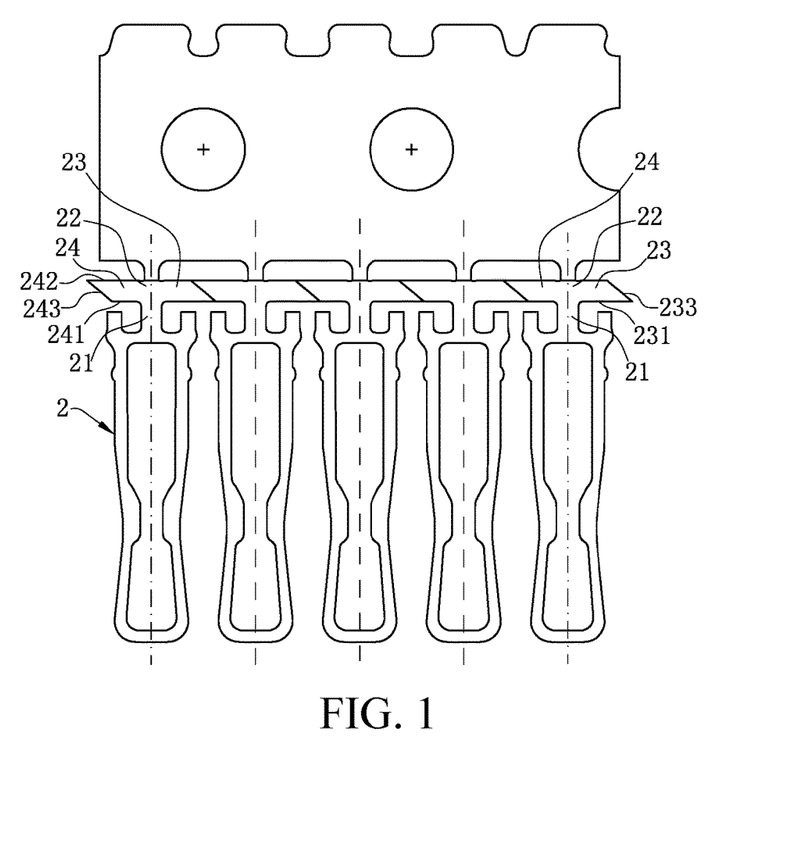
FIG. 1 is an expanded view of a terminal before cutting according to a first embodiment of the present invention.

As shown in FIG. 1, FIG. 3 and FIG. 6, before the terminals 2 are cut, the first clamping arms 23 and the second clamping arms 24 of a plurality of terminals 2 are connected with the same metal billet. The first clamping arm 23 and the second clamping arm 24 are symmetrically arranged about the center of the connection portion 22, and the first clamping arm 23 has a first upper edge 231 and a first lower edge 232 arranged opposite to each other, and the length of the first upper edge 231 is greater than that of the first lower edge 232. The second clamping arm 24 has a second upper edge 241 and a second lower edge 242 arranged opposite to each other, and the length of the second upper edge 241 is equal to that of the first lower edge 232, and the length of the second lower edge 242 is equal to that of the first upper edge 231. By such arrangement, as shown in FIG. 8, under conditions of not increasing metal billet and not changing a distance between the terminals, the sum II of the length of the first clamping arm 23 and the length of the second clamping arm 24 is obviously greater than the length I of the clamping portion of a known terminal, thereby increasing the clamping force of the first clamping arm 23 and the second clamping arm 24 against the solder material 3. Furthermore, as the length II is greater than the length I, it is easier for the first clamping arm 23 and the second clamping arm 24 to cross the central surface of the solder material 3 in a vertical direction, so that the first clamping arm 23 and the second clamping arm 24 can clamp more than half of the periphery of the solder material 3. Further, the first upper edge 231 and the second lower edge 242 are formed by bending and extending from each of the opposite two sides of the connection portion 22 towards a direction away from the connection portion 22 first and then reversely bending and extending. The first lower edge 232 and the second upper edge 241 are formed by bending and extending from each of the opposite two sides of the connection portion 22 towards a direction away from the connection portion 22. The first upper edge 231 and the second lower edge 242 cross the central surface of the solder material 3 in the vertical direction, while the first lower edge 232 and the second upper edge 241 do not pass over the central surface of the solder material 3 in the vertical direction. The lengths of the first upper edge 231 and the second lower edge 242 are increased to the maximum extent, so that the first clamping arm 23 and the second clamping arm 24 may clamp a larger periphery of the solder material 3. Furthermore, the first upper edge 231 and the second upper edge 241 are located above the central surface of the solder material 3 in a horizontal direction, and the first lower edge 232 and the second lower edge 242 are located below the central surface of the solder material 3 in the horizontal direction, so as to ensure that the first clamping arm 23 and the second clamping arm 24 can clamp the periphery of the central surface of the solder material 3 in the horizontal direction, and prevent the solder material 3 from shaking. In the present embodiment, the first upper edge 231 and the first lower edge 232 are connected through a first slope 233, and the second upper edge 241 and the second lower edge 242 are connected through a second slope 243. The inclining directions of the first slope 233 and the second slope 243 are just opposite, facilitating the cutting of the terminal 2 from the metal billet, reducing the forming difficulty of the terminal 2 and improving the production efficiency of the electrical connector 100. As further optimization, the fringes of the first lower edge 232 and the second lower edge 242 respectively incline towards a direction getting close to the solder material 3 to form a guide surface 25, preventing the solder material 3 from being scratched by the terminal 2 when the solder material 3 is mounted. The first upper edge 231 and the second upper edge 241 are located in the accommodating opening 11, and the first lower edge 232 and the second lower edge 242 are located outside the accommodating opening 11, so that the clamping force of the insulating body 1 against the terminal 2 is guaranteed, and meanwhile the soldering condition of the terminal 2 with the solder material 3 can be well observed to avoid missing soldering. When the terminal 2 is installed into the insulating body 1, the sum of the length of the first upper edge 231, the length of the second lower edge 242 and the length of the lower fringe of the connection portion 22 is greater than the distance between two adjacent terminals 2, so that the terminals 2 are arranged more densely, meeting the current demand of a large amount of terminals 2 in the electrical connector 100.

Figure 9:
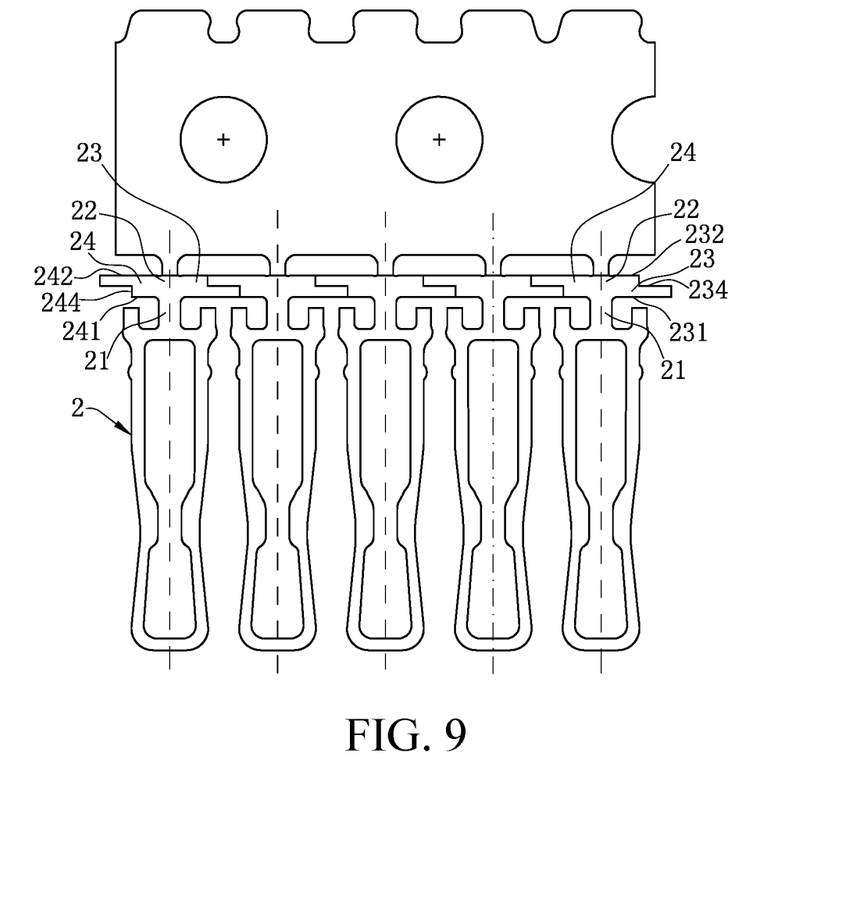
FIG. 9 is an expanded view of a terminal before cutting according to a second embodiment of the present invention.
Figure 10:
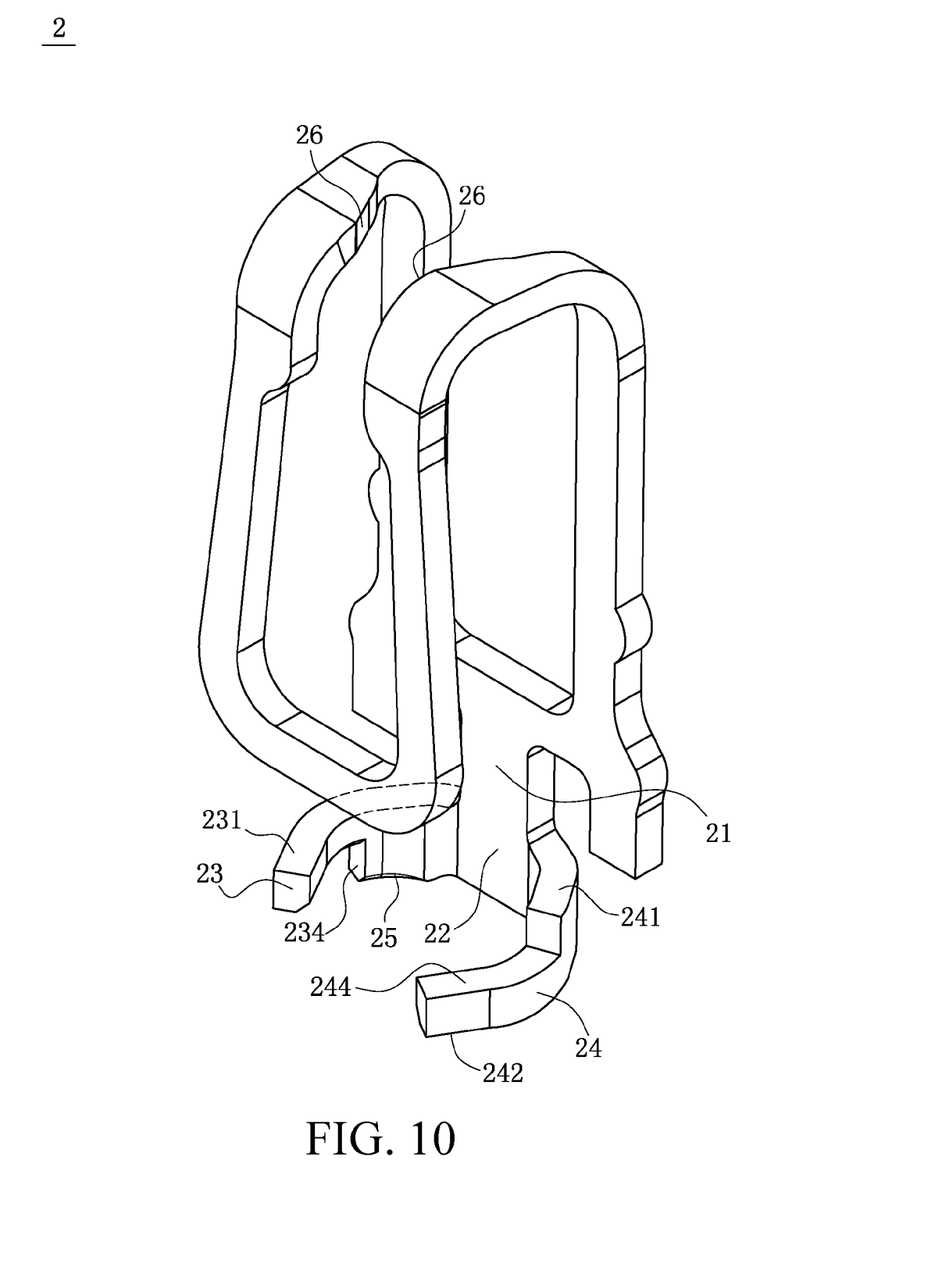
FIG. 10 is a three-dimensional view of the terminal according to the second embodiment of the present invention.

A second embodiment for a terminal 2 of an electrical connector 100 of the present invention is as shown in FIG. 9 and FIG. 10. The present embodiment is different from the first embodiment in that the first upper edge 231 and the first lower edge 232 are connected through a first step 234, the second upper edge 241 and the second lower edge 242 are connected through a second step 244, and the second step 244 and the first step 234 are reversely arranged. Other structures and functions of the second embodiment are identical with those of the first embodiment, therefore the descriptions thereof are omitted herein.

To sum up, the electrical connector 100 and the terminal 2 thereof of the present invention have the following beneficial advantages:

(1) As the length II is greater than the length I, it is easier for the first clamping arm 23 and the second clamping arm 24 to cross the central surface of the solder material 3 in a vertical direction, so that the first clamping arm 23 and the second clamping arm 24 can clamp more than half of the periphery of the solder material 3.

(2) The length of the first upper edge 231 is not equal to the length of the first lower edge 232; if the length of the first upper edge 231 is greater than the length of the first lower edge 232, under conditions of not increasing the length of a metal billet and not changing the distance between the terminals, the length of the first upper edge 231 is increased, and the length of the first lower edge 232 is decreased. In other words, the length of the whole first clamping arm 23 is increased, in other words, in FIG. 8, the sum II of the length of the first clamping arm 23 and the length of the second clamping arm 24 is obviously greater than the length I of the clamping portion of a known terminal, thereby increasing the clamping force of the first clamping arm 23 and the second clamping arm 24 against the tin ball, avoiding poor soldering between the terminal 2 and the circuit board 5, and improving the production qualification rate of the electrical connector 100.

(3) The first upper edge 231 and the first lower edge 232 are connected through a first slope 233, and the second upper edge 241 and the second lower edge 242 are connected through a second slope 243. The inclining directions of the first slope 233 and the second slope 243 are just opposite, facilitating the cutting of the terminal 2 from the metal billet, reducing the forming difficulty of the terminal 2 and improving the production efficiency of the electrical connector 100.

(4) The first upper edge 231 and the second lower edge 242 cross the central surface of the solder material 3 in the vertical direction, while the first lower edge 232 and the second upper edge 241 do not pass over the central surface of the solder material 3 in the vertical direction. The lengths of the first upper edge 231 and the second lower edge 242 are increased to the maximum extent, so that the first clamping arm 23 and the second clamping arm 24 may clamp a larger periphery of the solder material 3.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, used for electrically connecting a chip module to a circuit board, comprising:
   an insulating body, provided with a plurality of accommodating openings; and
   a plurality of terminals, correspondingly accommodated in the accommodating openings respectively, wherein each terminal has a connection portion, two sides of the connection portion bend and extend to form a first clamping arm and a second clamping arm, respectively, the first clamping arm and the second clamping arm together clamp a solder material, the first clamping arm has a first upper edge and a first lower edge arranged opposite to each other, the length of the first upper edge is greater than the length of the first lower edge, the second clamping arm has a second upper edge and a second lower edge arranged opposite to each other, and the length of the second lower edge is greater than the length of the second upper edge.

2. The electrical connector according to claim 1, wherein the solder material is a tin ball, and the first clamping arm and the second clamping arm cross the central surface of the solder material in a vertical direction.

3. The electrical connector according to claim 2, wherein the first upper edge crosses the central surface of the solder material in the vertical direction, and the first lower edge does not pass over the central surface of the solder material in the vertical direction.

4. The electrical connector according to claim 1, wherein the first upper edge is formed by bending and extending from one side of the connection portion towards a direction away from the connection portion first and then reversely bending and extending, and the first lower edge is formed by bending and extending from one side of the connection portion towards a direction away from the connection portion.

5. The electrical connector according to claim 1, wherein the first upper edge is located above the central surface of the solder material in a horizontal direction, and the second lower edge is located below the central surface of the solder material in the horizontal direction.

6. The electrical connector according to claim 1, wherein the first clamping arm has a first slope connecting the first upper edge with the first lower edge, and the first slope inclines downward.

7. The electrical connector according to claim 1, wherein the first clamping arm has a first step connecting the first upper edge with the first lower edge.

8. The electrical connector according to claim 1, wherein the fringe of the first lower edge inclines towards a direction getting close to the solder material, to form a guide surface.

9. The electrical connector according to claim 1, wherein the first upper edge is accommodated in the accommodating opening, and the first lower edge is located outside the accommodating opening.

10. The electrical connector according to claim 1, wherein the terminal has a base, the base extends downward to form the connection portion, the base extends upward and then horizontally bends and extends to form two elastic arms arranged opposite to each other, and the two elastic arms clamp pins of the chip module.

11. The electrical connector according to claim 1, wherein a plurality of the terminals are fixed on the insulating body in a multi-row manner, and the sum of the length of the first upper edge, the length of the second lower edge and the length of the lower fringe of the connection portion is greater than a distance between two adjacent terminals.

12. A terminal, comprising:
a base;
a contact portion, formed by extending upward from the base;
a connection portion, formed by extending downward from the base;
a first clamping arm, formed by bending from one side of the connection portion, wherein the first clamping arm has a first upper edge and a first lower edge arranged opposite to each other, and the first upper edge is closer to the contact portion than the first lower edge;
a second clamping arm, formed by bending from the other side of the connection portion, wherein the second clamping arm has a second upper edge and a second lower edge arranged opposite to each other, the second upper edge is closer to the contact portion than the second lower edge, the length of the first upper edge is greater than the length of the first lower edge, and the length of the second lower edge is greater than the length of the second upper edge.

13. The terminal according to claim 12, wherein the first upper edge is formed by bending and extending from one side of the connection portion towards a direction away from the connection portion first and then reversely bending and extending, and the first lower edge is formed by bending and extending from one side of the connection portion towards a direction away from the connection portion.

14. The terminal according to claim 12, wherein the first clamping arm has a first slope connecting the first upper edge with the first lower edge, and the first slope inclines downward.

15. The terminal according to claim 12, wherein the first clamping arm has a first step for connecting the first upper edge with the second upper edge.

16. The terminal according to claim 12, wherein the fringes of the first lower edge and the second lower edge incline towards a direction getting close to the connection portion, to form a guide surface.

17. The terminal according to claim 12, wherein the connection portion is flat-plate-shaped, and the first clamping arm and the second clamping arm are arc-shaped.

18. The terminal according to claim 12, wherein the contact portion is two elastic arms arranged opposite to each other, wherein the base extends upward and then horizontally bends and extends to form the two elastic arms arranged opposite to each other.

19. The electrical connector according to claim 1, wherein the length of the first upper edge is greater than the length of the second upper edge, and the length of the second lower edge is greater than the length of the first lower edge.

20. The terminal according to claim 12, wherein the length of the first upper edge is greater than the length of the second upper edge, and the length of the second lower edge is greater than the length of the first lower edge.

* * * * *